United States Patent
Kim

(10) Patent No.: US 6,953,973 B2
(45) Date of Patent: Oct. 11, 2005

(54) SELF-ALIGNED TRENCH ISOLATION METHOD AND SEMICONDUCTOR DEVICE FABRICATED USING THE SAME

(75) Inventor: Sun-Young Kim, Gyeonggi-do (KR)

(73) Assignee: Samsung Electronics Co., Ltd., Suwon-si (KR)

(*) Notice: Subject to any disclaimer, the term of this patent is extended or adjusted under 35 U.S.C. 154(b) by 0 days.

(21) Appl. No.: 10/798,610

(22) Filed: Mar. 10, 2004

(65) Prior Publication Data

US 2004/0183139 A1 Sep. 23, 2004

(30) Foreign Application Priority Data

Mar. 20, 2003 (KR) .......................... 2003-17582

(51) Int. Cl.[7] .............................................. H01L 29/94
(52) U.S. Cl. ........................................ 257/374; 257/390
(58) Field of Search ................................ 257/374, 390

(56) References Cited

U.S. PATENT DOCUMENTS

| | | | | |
|---|---|---|---|---|
| 4,495,025 A | * | 1/1985 | Haskell | 438/427 |
| 5,576,226 A | * | 11/1996 | Hwang | 438/275 |
| 6,596,608 B2 | * | 7/2003 | Saito | 438/424 |
| 6,780,715 B2 | * | 8/2004 | Jeong | 438/275 |
| 2002/0016041 A1 | | 2/2002 | Boo et al. | 438/263 |

FOREIGN PATENT DOCUMENTS

JP 2000-195969 7/2000
KR 2003-0003062 1/2003

OTHER PUBLICATIONS

English language abstract of Japanese Publication No. 2000–195969.

English language abstract of Korean Publication No. 2003–0003062.

* cited by examiner

*Primary Examiner*—David Nelms
*Assistant Examiner*—Tu-Tu Ho
(74) *Attorney, Agent, or Firm*—Marger Johnson & McCollom, P.C.

(57) ABSTRACT

A method according to some embodiments of the invention includes forming a first gate pattern on a first region of a semiconductor substrate. The first gate pattern is formed to have a first gate insulating layer pattern, a first lower gate conductive layer pattern and a gate etching stopper layer pattern which are sequentially stacked. A second gate pattern is formed on a second region spaced apart from the first region to define a border region between the first and second regions. The second gate pattern is formed to have a second gate insulating layer pattern and a second lower gate conductive layer pattern, which are sequentially stacked. Thus, some embodiments may prevent two different gate conductive layers from overlapping with each other in the border region. Accordingly, semiconductor memory devices according to some embodiments of the invention do not have undesired active regions formed in the border region.

23 Claims, 10 Drawing Sheets

SELF-ALIGNED TRENCH ISOLATION METHOD AND SEMICONDUCTOR DEVICE FABRICATED USING THE SAME

CROSS REFERENCE TO RELATED APPLICATIONS

This application claims priority from Korean Patent Application No. 2003-0017582, filed Mar. 20, 2003, the disclosure of which is hereby incorporated herein by reference in its entirety.

BACKGROUND OF INVENTION

1. Technical Field of the Invention

This disclosure relates to methods of manufacturing a semiconductor device and semiconductor devices fabricated using the same and, more particularly, to self-aligned trench isolation methods of a semiconductor device that employs at least two gate insulating layers having different thickness and semiconductor devices manufactured using the same.

2. Description of the Related Art

Semiconductor devices include discrete devices such as transistors. Isolation techniques are used in order to separate the transistors.

Recently, a trench isolation technique has been widely used. In particular, a self-aligned trench isolation technique is broadly used in fabrication of semiconductor memory devices such as flash memory devices in order to improve characteristics of flash memory cells.

Semiconductor memory devices such as the flash memory devices may include a cell array region and a peripheral circuit region. The cell array region may include a plurality of cell transistors arranged in a two-dimensional array, and the peripheral circuit region may include high voltage transistors and low voltage transistors. In flash memory devices, each of the cell transistors typically has a stacked gate pattern, which is composed of a tunnel oxide layer, a floating gate, an inter-gate insulating layer, and a control gate electrode that are sequentially stacked. Also, the high voltage transistor employs a gate insulating layer which is thicker than the tunnel oxide layer. Accordingly, there may be some limitations in applying the self-aligned trench isolation technique to the flash memory devices.

A method of fabricating the flash memory device using the self-aligned trench isolation technique is taught in U.S. Patent Publication No. US 2002/0016041 A1 to Boo et al., entitled "Method Of Fabricating A Non-Volatile Memory Device Having A Tunnel Insulating Layer Including More Than Two Portions Of Different Thickness".

According to Boo et al., a tunnel insulating layer and a gate insulating layer thicker than the tunnel insulating layer are formed on a cell array region and a peripheral circuit region of a semiconductor substrate, respectively. A conductive layer and a first insulating layer are sequentially formed on the entire surface of the semiconductor substrate having the tunnel insulating layer and the gate insulating layer. The first insulating layer, the conductive layer, the tunnel insulating layer, the gate insulating layer, and the semiconductor substrate are dry-etched to form a trench region that defines active regions. In this case, a sidewall of the trench region generally exhibits a positive sloped profile due to characteristics of the dry etching process. In other words, an upper width of the trench region is greater than the lower width thereof. An isolation layer is then formed in the trench region. As a result, a sidewall of the isolation layer has a negative sloped profile.

The first insulating layer is removed to expose the conductive layer. As a result, the isolation layer is relatively protruded. A protrusion of the isolation layer also has a negative sloped profile. Hence, in the event that the conductive layer is patterned to form floating gate patterns separated from each other in the cell array region in a subsequent process, stringers may exist between the floating gate patterns. In order to solve the problem described above, Boo et al. use a chemical mechanical polishing (CMP) technique to remove the protrusion from the isolation layer.

Notwithstanding the removal of the protrusion from the isolation layer, the self-aligned trench isolation technique described above has several disadvantages.

FIGS. 1 to 8 are cross-sectional diagrams illustrating a conventional self-aligned trench isolation method in conjunction with a flash memory device.

Referring to FIG. 1, a gate insulating layer 3, a lower gate conductive layer 5 and a gate etching stopper layer 7 are sequentially formed over the entire surface of a semiconductor substrate 1. The gate etching stopper layer 7, the lower gate conductive layer 5 and the gate insulating layer 3 are patterned to expose a predetermined region of the semiconductor substrate 1. The exposed region of the semiconductor substrate 1 corresponds to a cell array region A, and the region covered with the patterned gate etching stopper layer 7 corresponds to a peripheral circuit region B. A tunnel oxide layer 9, a conductive layer 11 and a hard mask layer 13 are sequentially formed on the resultant structure where the semiconductor substrate 1 in the cell array region A is exposed.

A first photoresist pattern 15 is formed on the hard mask layer 13. The first photoresist pattern 15 is formed to cover an adjacent region to the cell array region A as well as the cell array region A with consideration of mis-alignment occurred during a photolithography process. As a result, an edge of the first photoresist pattern 15 overlaps with an edge of the patterned gate etching stopper layer 7 as shown in FIG. 1. Thus, a border region D composed of the overlapping region between the cell array region A and the peripheral circuit region B is defined.

Referring to FIG. 2, the hard mask layer 13 is etched using the first photoresist pattern 15 as an etching mask to form a hard mask pattern 13a that covers the cell array region A and the border region D. The first photoresist pattern 15 is then removed. The conductive layer 11 is etched using the hard mask pattern 13a as an etching mask to form a lower floating layer a below the hard mask pattern 13a.

Referring to FIG. 3, the hard mask pattern 13a and the gate etching stopper layer 7 are blanket-etched to expose the lower floating gate layer 11a and the lower gate conductive layer 5. As a result, a gate etching stopper layer pattern 7a exists in the border region D. The gate etching stopper layer pattern 7a is interposed between the lower gate conductive layer 5 and the lower floating gate layer 11a.

A buffer oxide layer 17, a CMP stopper layer 19 and a hard mask layer 21 are sequentially formed over the entire surface of the semiconductor substrate 1 where the lower floating gate layer 11a and the lower gate conductive layer 5 are exposed. A second photoresist pattern 23 is formed on the hard mask layer 21. The second photoresist pattern 23 includes a cell active pattern 23a and a peripheral circuit active pattern 23b that define a cell active region and a peripheral circuit active region in the cell array region A and the peripheral circuit region B, respectively. The peripheral circuit active pattern 23b is formed to cover a portion of the border region D. This prevents the chip size of the semiconductor device from increasing.

Referring to FIG. 4, the hard mask layer 21, the CMP stopper layer 19, and the buffer oxide layer 17 are successively patterned using the second photoresist pattern 23 as an etching mask. As a result, a first trench mask pattern covering a predetermined portion in the cell array region A is formed, and a second trench mask pattern covering an edge portion of the peripheral circuit region B and an edge portion of the border region D is formed. The first trench mask pattern includes a first buffer oxide layer pattern 17a, a first CMP stopper layer pattern 19a and a first hard mask pattern 21a which are sequentially stacked, and the second trench mask pattern includes a second buffer oxide layer pattern 17b, a second CMP stopper layer pattern 19b and a second hard mask pattern 21b which are sequentially stacked. The second photoresist pattern 23 is then removed.

Referring to FIG. 5, the tunnel oxide layer 9 and the gate insulating layer 3 as well as the lower floating gate layer 11a and the lower gate conductive layer 5 are etched using the first and second trench mask patterns as etching masks. As a result, a tunnel oxide layer pattern 9a and a lower floating gate pattern 11b which are sequentially stacked below the first trench mask pattern are formed, and a gate insulating layer pattern 3a and a lower gate electrode pattern 5a which are sequentially stacked below the second trench mask pattern are formed. In addition, the gate etching stopper layer pattern 7a and a conductive layer pattern 11c composed of a portion of the lower floating gate layer 11a remain between the lower gate electrode pattern 5a and the second trench mask pattern.

Referring to FIG. 6, the semiconductor substrate 1 is etched using the first and second trench mask patterns as etching masks to form a trench region 25. As a result, a cell active region 25a is defined in the cell array region A and a guard band active region 25d is defined in the border region D and an edge of the peripheral circuit region B.

Referring to FIGS. 7 and 8, an insulating layer is formed on the entire surface of the semiconductor substrate 1 having the trench region 25. The insulating layer is planarized until the first and second CMP stopper layer patterns 19a and 19b are exposed, thereby forming an isolation layer 27 in the trench region 25. Subsequently, the CMP stopper layer patterns 19a and 19b and the buffer oxide layer patterns 17a and 17b are removed to expose the lower floating gate pattern 11b and the lower gate electrode pattern 5a. The CMP stopper layer patterns 19a and 19b and the buffer oxide layer patterns 17a and 17b are removed using a wet etching technique in order to prevent surfaces of the lower floating gate pattern 11b and the lower gate electrode pattern 5a from being damaged. When the CMP stopper layer patterns 19a and 19b and the buffer oxide layer patterns 17a and 17b are excessively wet-etched, the conductive layer pattern 11c in the border region D may be lifted off. In particular, as the semiconductor devices become more highly integrated, a width of the conductive layer pattern 11c has been reduced. In this case, the conductive layer pattern 11c may be easily lifted off.

Meanwhile, in order to prevent the conductive layer pattern 11c from being lifted off, a wet-etching process time should be reduced. In this case, as shown in FIG. 8, the gate etching stopper layer pattern 7a may exist on the lower gate electrode pattern 5a in the border region D. Hence, the lower gate electrode 5a in the border region D may not be removed in a subsequent process. Consequently, it is not possible to dope the guard band active region 25d with impurity ions through a conventional semiconductor manufacturing process. In other words, it is impossible to form an impurity region such as a well pick up region in the guard band active region 25d. Hence, the guard band active region 25d in the border region D loses its inherent function, thereby increasing a chip size.

Embodiments of the invention address these and other disadvantages of the conventional art.

SUMMARY OF THE INVENTION

Some embodiments of the invention prevent two different gate conductive layers from overlapping with each other in a border region between the cell array region and the peripheral circuit region of a semiconductor memory device. Accordingly, it is possible to prevent undesired active regions from being formed in the border region.

DETAILED DESCRIPTION OF THE INVENTION

Figure 1:
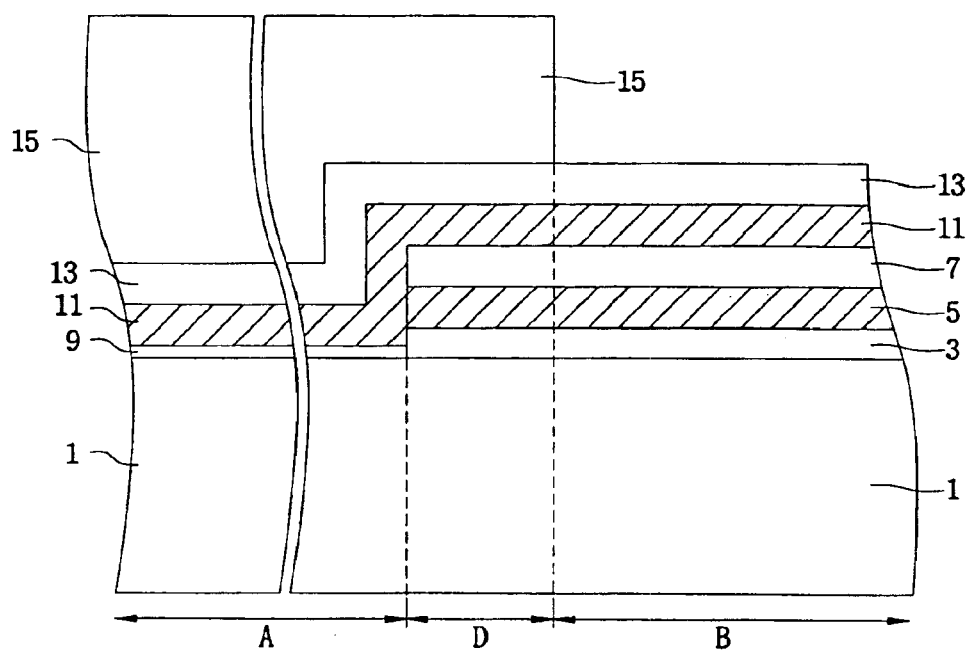
FIGS. 1 to 8 are cross-sectional diagrams illustrating a conventional self-aligned trench isolation method.
Figure 2:
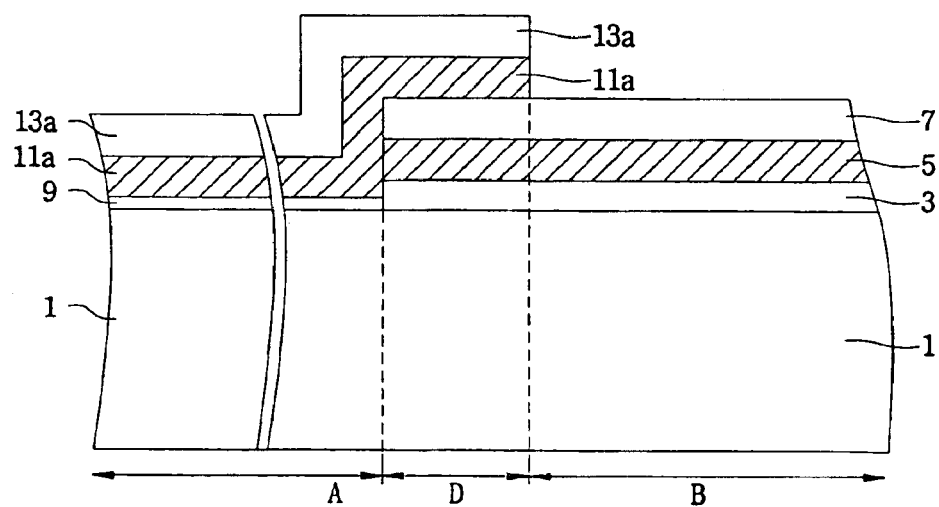
Figure 3:
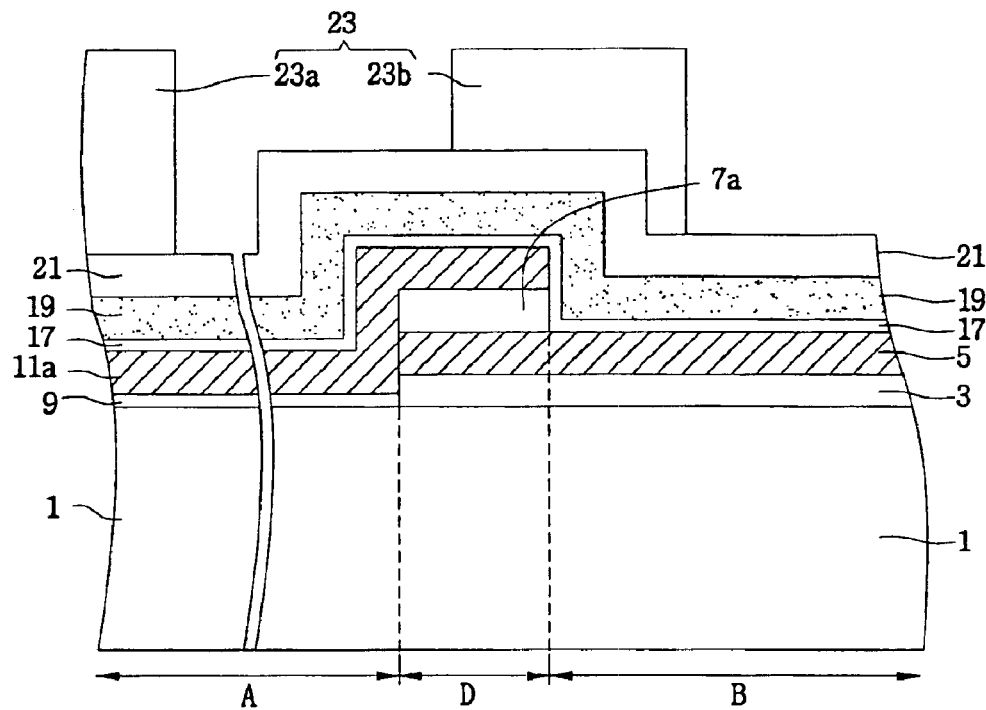
Figure 4:
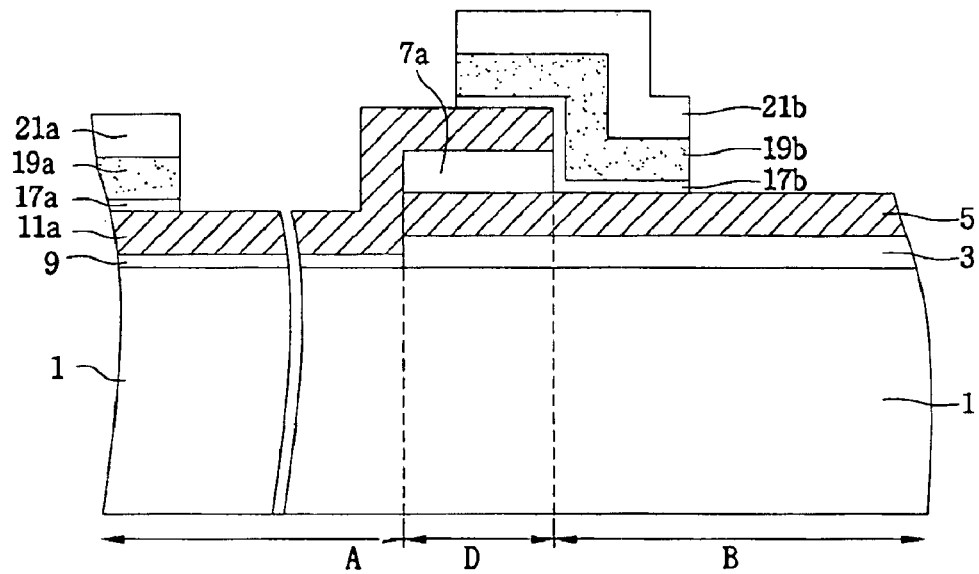
Figure 5:
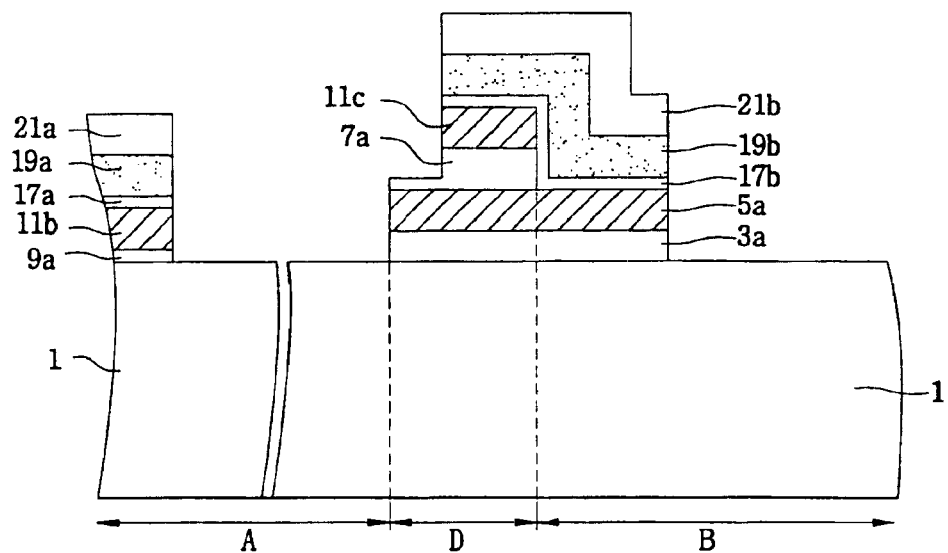
Figure 6:
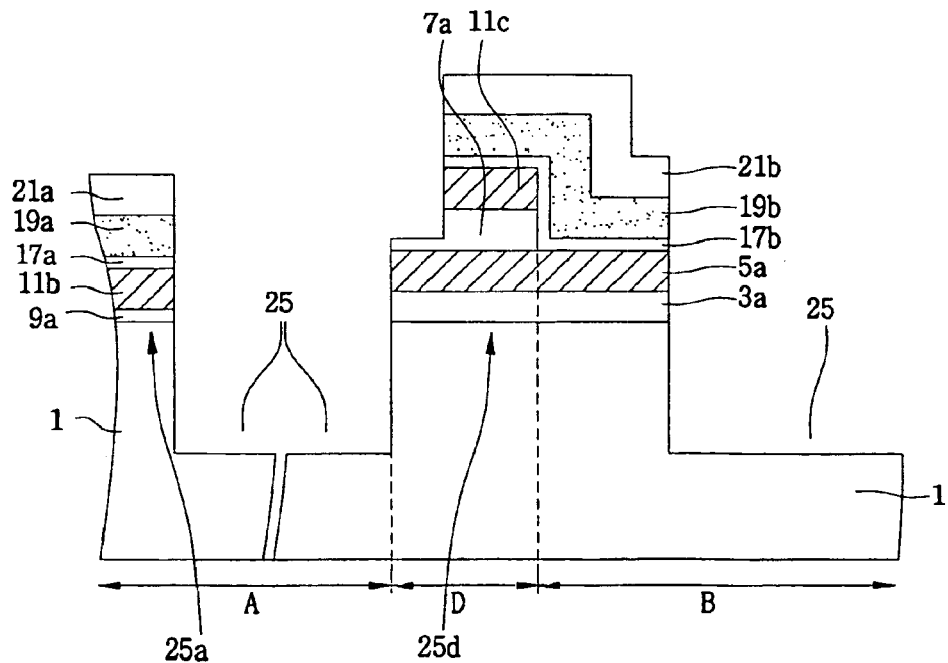
Figure 7:
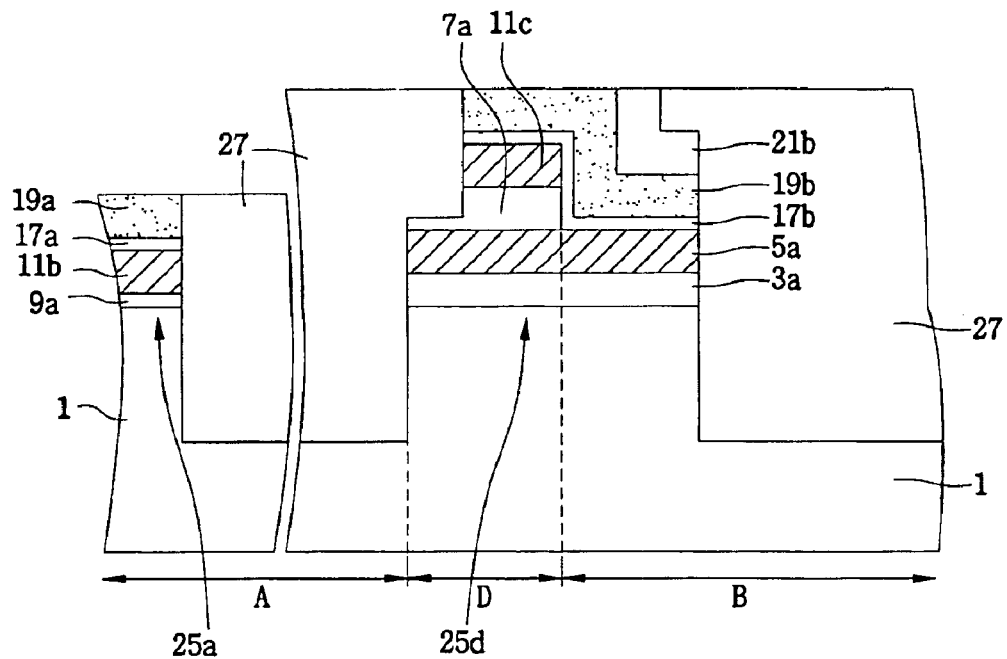
Figure 8:
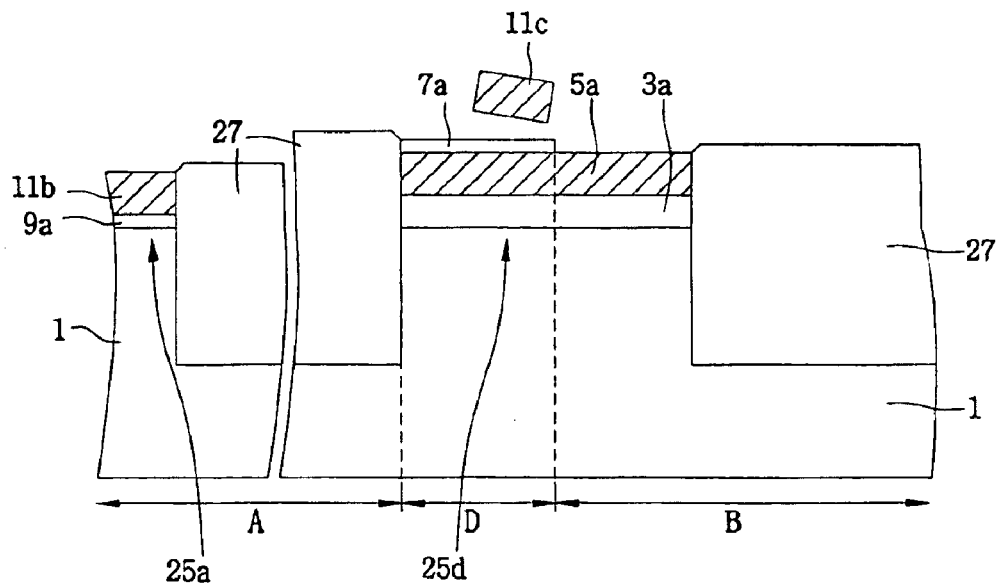

Embodiments of the invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be through and complete, and will fully convey the scope of the invention to those skilled in the art. In the drawings, the thickness of the layers and regions are exaggerated for clarity. Like numbers refer to like elements throughout the specification.

FIGS. 9 to 15 are cross-sectional diagrams illustrating self-aligned trench isolation methods according to some embodiments of the invention and semiconductor memory devices fabricated using the same.

Figure 9:
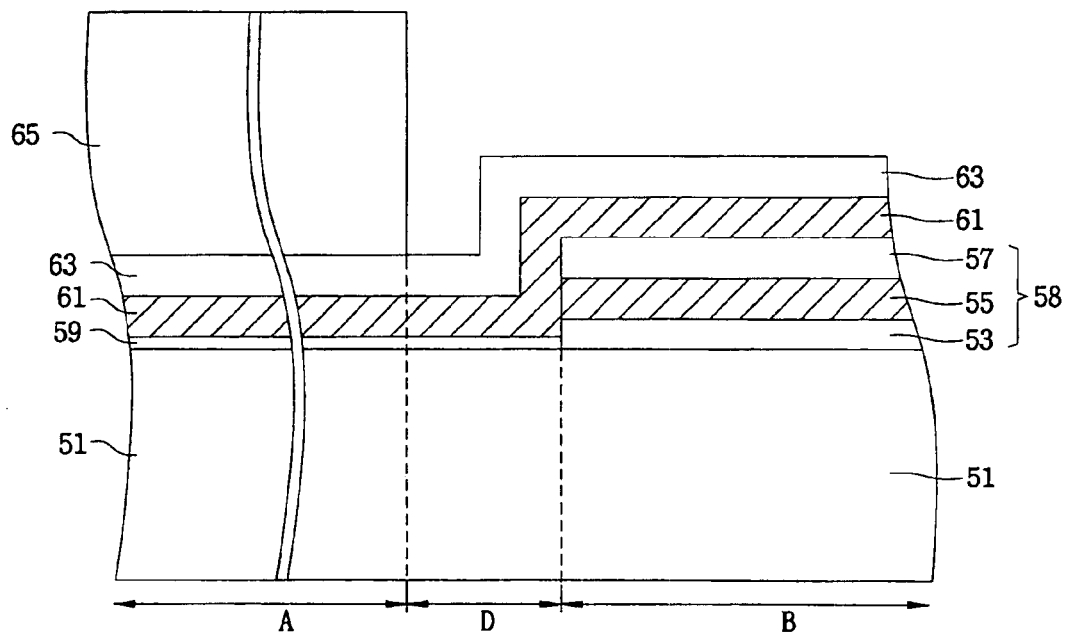
FIGS. 9 to 15 are cross-sectional diagrams illustrating self-aligned trench isolation methods according to some embodiments of the invention and semiconductor memory devices fabricated using the same.

Referring to FIG. 9, a first gate insulating layer, a first lower gate conductive layer and a gate etching stopper layer are sequentially formed over a semiconductor substrate 51. The first gate insulating layer may be formed of a thermal oxide layer, and the first lower gate conductive layer may be formed of a semiconductor layer which is the same material as the semiconductor substrate 51. For example, if the semiconductor substrate 51 is a silicon substrate, the first lower gate conductive layer may be formed of a doped silicon layer such as a doped polysilicon layer or a doped amorphous silicon layer. Also, the gate etching stopper layer is preferably formed of an insulating layer having an etching selectivity with respect to the first lower gate conductive layer. For example, the gate etching stopper layer may be formed of a CVD oxide layer.

The gate etching stopper layer, the first lower gate conductive layer, and the first gate insulating layer are patterned to form a first gate insulating layer pattern 53, a first lower gate conductive layer pattern 55, and a gate etching stopper layer pattern 57 that are sequentially stacked on a first region B of the semiconductor substrate 51. The first gate insulating layer pattern 53, the first lower gate conductive layer pattern 55, and the gate etching stopper layer pattern 57 constitute a first gate pattern 58. The first region B may be a peripheral circuit region of a semiconductor device such as a flash memory device. In this case, the first gate insulating layer 53 corresponds to a peripheral circuit gate insulating layer pattern.

A second gate insulating layer 59 and a second lower gate conductive layer 61 are sequentially formed on the entire surface of the semiconductor substrate having the first gate pattern 58. The second gate insulating layer 58 may be formed of a thermal oxide layer and has a different thickness from the first gate insulating layer pattern 53. The second lower gate conductive layer 61 may be formed of the same conductive layer as the first lower gate conductive layer pattern 55. Further, it is preferable that a first hard mask layer 63 is additionally formed on the second lower gate conductive layer 61. The first hard mask layer 63 is preferably formed of the same material layer as the gate etching stopper layer pattern 57.

A first photoresist pattern 65 is formed on the first hard mask layer 63. The first photoresist pattern 65 is formed to cover a second region A spaced apart from the first region B. Hence, a border region D having a predetermined width is defined between the first and second regions B and A. If the first region B is the peripheral circuit region of the flash memory device, the second region A is a cell array region of the flash memory device. In this case, the second gate insulating layer 59 corresponds to a tunnel oxide layer, and the second lower gate conductive layer 61 corresponds to a lower floating gate layer.

Figure 10:
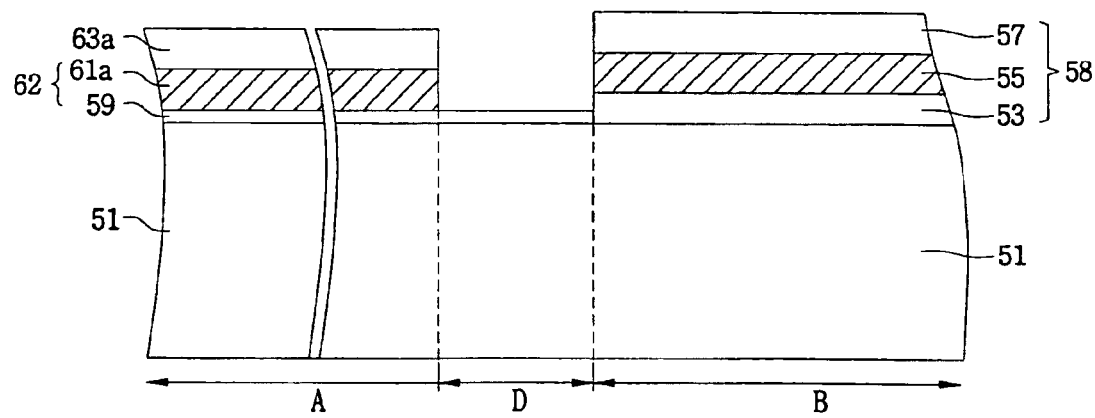

Referring to FIG. 10, the first hard mask layer 63 is etched using the first photoresist pattern 65 as an etching mask to form a first hard mask pattern 63a in the cell array region A. Then, the first photoresist pattern 65 is removed. The second lower gate conductive layer 61 is etched using the first hard mask pattern 63a as an etching mask to form a second lower gate conductive layer pattern 61a that covers the cell array region A.

When the first hard mask pattern 63a is formed, the second lower gate conductive layer 61 is preferably etched using a wet-etching technique. Consequently, the second gate insulating layer 59, the second lower gate conductive layer pattern 61a and the first hard mask pattern 63a, which are sequentially stacked in the cell array region A, are formed. The second gate insulating layer 59 and the second lower gate conductive layer pattern 61a constitute a second gate pattern 62, for example, a cell gate pattern.

Meanwhile, in the event that a process for forming the first hard mask layer 63 is skipped, the second lower gate conductive layer 61 is etched using the first photoresist pattern 65 as an etching mask. In this case, the first hard mask pattern 63a is not formed in the cell array region A.

Figure 11:
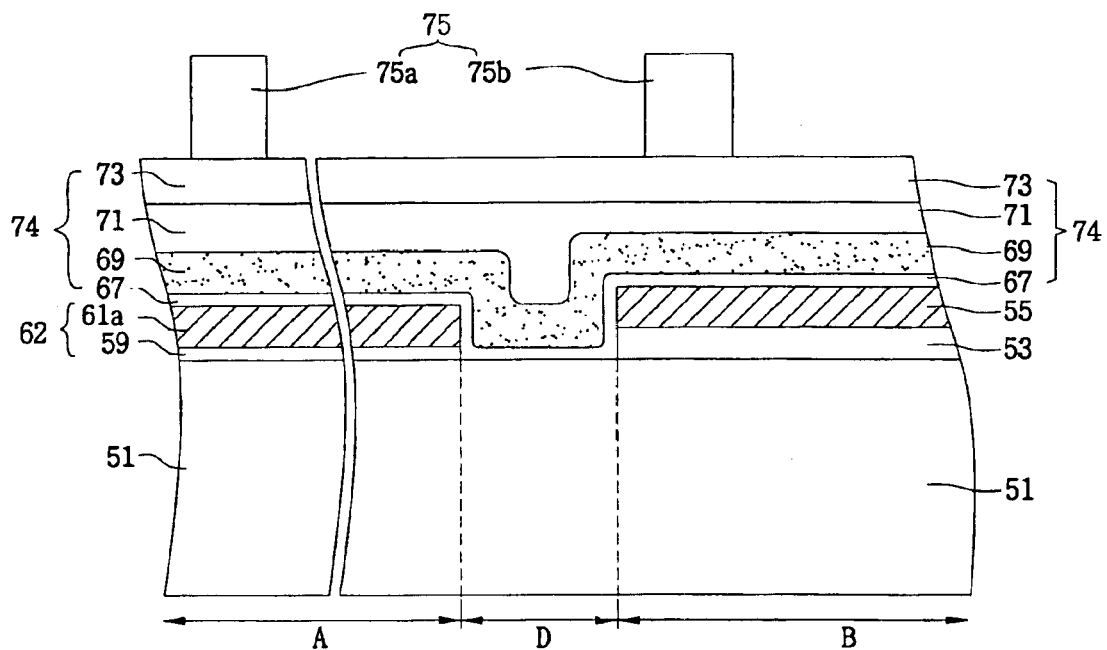

Referring to FIG. 11, the gate etching stopper layer pattern 57 and the first hard mask pattern 63a are removed using an oxide etchant. As a result, the first lower gate conductive layer pattern 55 and the second lower gate conductive layer pattern 61a are exposed, and the border region D of the semiconductor substrate 51 may also be exposed. A trench mask layer 74 is formed on the entire surface of the semiconductor substrate 51 where the gate etching stopper layer pattern 57 and the first hard mask pattern 63a are removed. The trench mask layer 74 includes at least a polishing stopper layer 69. Preferably, the trench mask layer 74 is formed by sequentially stacking a buffer oxide layer 67, the polishing stopper layer 69 and a second hard mask layer 71. The trench mask layer 74 may further include an anti-reflective layer 73 formed on the second hard mask layer 71. The polishing stopper layer 69 may be made of a silicon nitride layer, and the buffer oxide layer 74 may be made of a CVD oxide layer. The buffer oxide layer 67 functions to prevent a physical stress of the polishing stopper layer 69 from being applied to the first and second gate conductive layer patterns 55 and 61a.

A second photoresist pattern 75 is formed on the trench mask layer 74 to define active regions. The second photoresist pattern 75 includes a cell active pattern 75a covering a predetermined portion of the cell array region A and a peripheral active pattern 75b covering a predetermined portion of the peripheral circuit region B.

Figure 12:
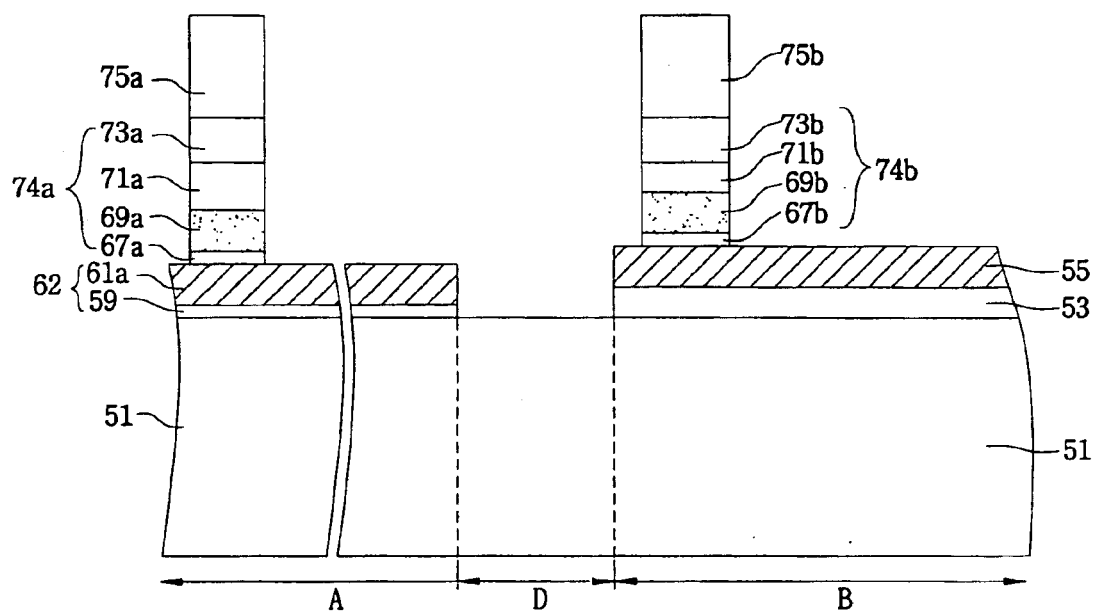

Referring to FIG. 12, the trench mask layer 74 is etched using the second photoresist pattern 75 as an etching mask to form first and second trench mask patterns 74b and 74a in the peripheral circuit region B and the cell array region A, respectively. The first trench mask pattern 74b includes a first buffer oxide layer pattern 67b, a first polishing stopper layer pattern 69b, a hard mask pattern 71b, and a first anti-reflective layer pattern 73b that are sequentially stacked, and the second trench mask pattern 74a includes a second buffer oxide layer pattern 67a, a second polishing stopper layer pattern 69a, a hard mask pattern 71a, and a second anti-reflective layer pattern 73a that are sequentially stacked. In this case, the border region D of the semiconductor substrate 51 is exposed. The second photoresist pattern 75 is then removed.

Figure 13:
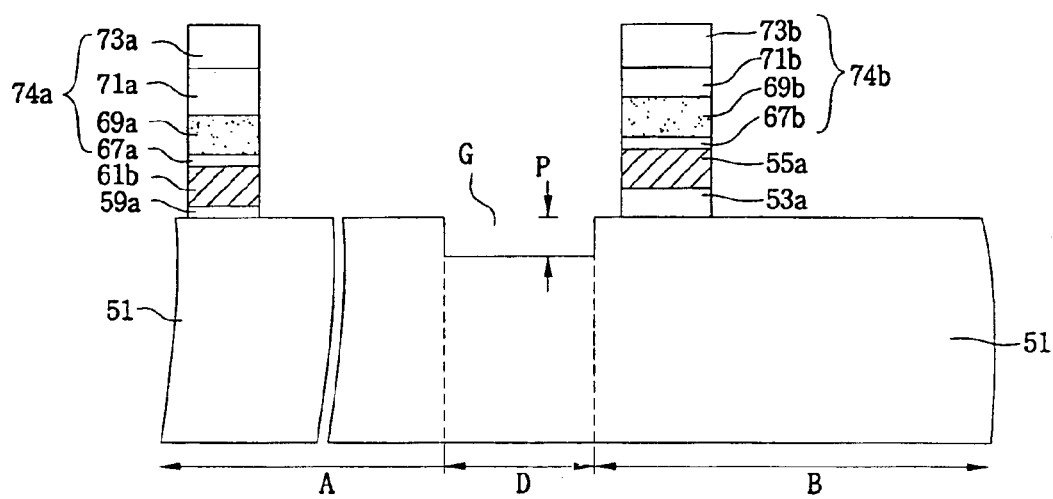

Referring to FIG. 13, the first and second lower gate conductive layer patterns 55 and 61a are etched using the first and second trench mask patterns 74b and 74a as etching masks to expose the first and second gate insulating layer patterns 53 and 59. As a result, a first lower gate electrode pattern 55a is formed below the first trench mask pattern 74b, and a second lower gate electrode pattern 61b is formed below the second trench mask pattern 74a. In the event that the cell array region A corresponds to the cell array region of the flash memory device, the second lower gate electrode pattern 61b corresponds to a lower floating gate pattern. The border region D of the semiconductor substrate 51 may also be etched during an etching process of the first and second lower gate conductive layer patterns 55 and 61a. Thus, a groove region G having a predetermined depth P may be formed in the border region D.

Subsequently, the exposed portions of the first and second gate insulating layer patterns 53 and 59 are etched using the first and second trench mask patterns 74b and 74a as etching masks, thereby exposing the semiconductor substrate 51 in the first and second regions B and A. As a result, first and second gate insulating layers 53a and 59a are formed below the first and second lower gate electrode patterns 55a and 61b, respectively.

Figure 14:
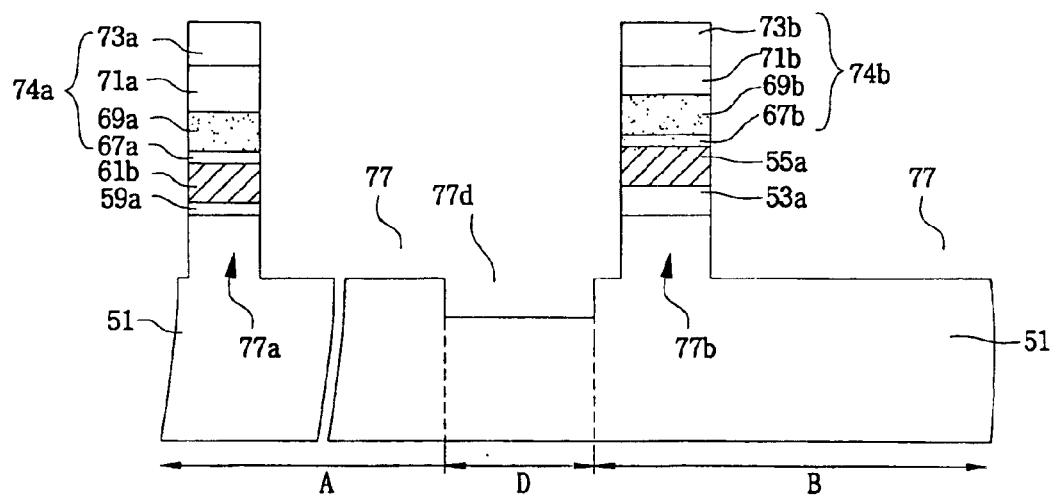
Figure 15:
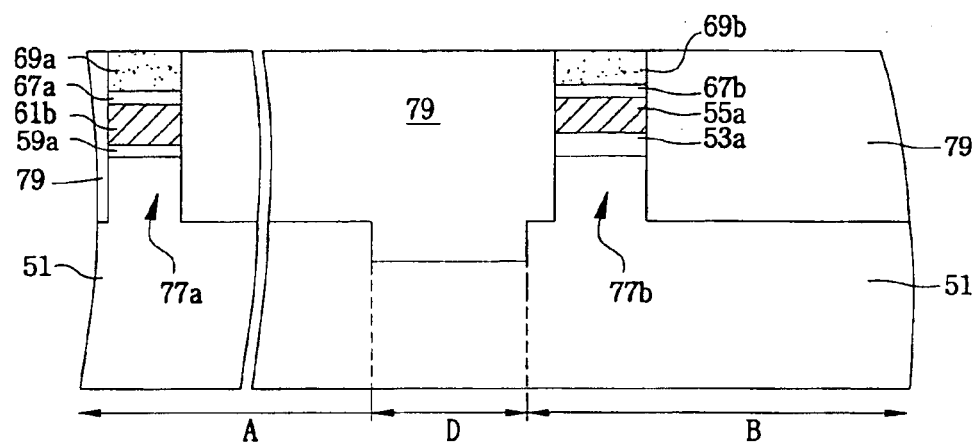

Referring to FIGS. 14 and 15, the exposed portion of the semiconductor substrate 51 is etched using the first and second trench mask patterns 74b and 74a as etching masks. As a result, trench regions 77 are formed in the cell array region A and the peripheral circuit region B, and a border trench region 77d is formed in the border region D. The trench region 77 in the peripheral circuit region B defines a first active region (e.g., a peripheral circuit active region) 77b, and the trench region 77 in the cell array region A defines a second active region (e.g., a cell active region) 77a. The border trench region 77d is formed to be deeper than the trench regions 77 due to the groove region G, as shown in FIG. 14. An isolation layer 79 is then formed in the trench regions 77 and the border trench region 77d using a well-known method.

FIGS. 16 to 19 are cross-sectional diagrams illustrating self-aligned trench isolation methods according to other embodiments of the invention and semiconductor devices fabricated using the same.

Figure 16:
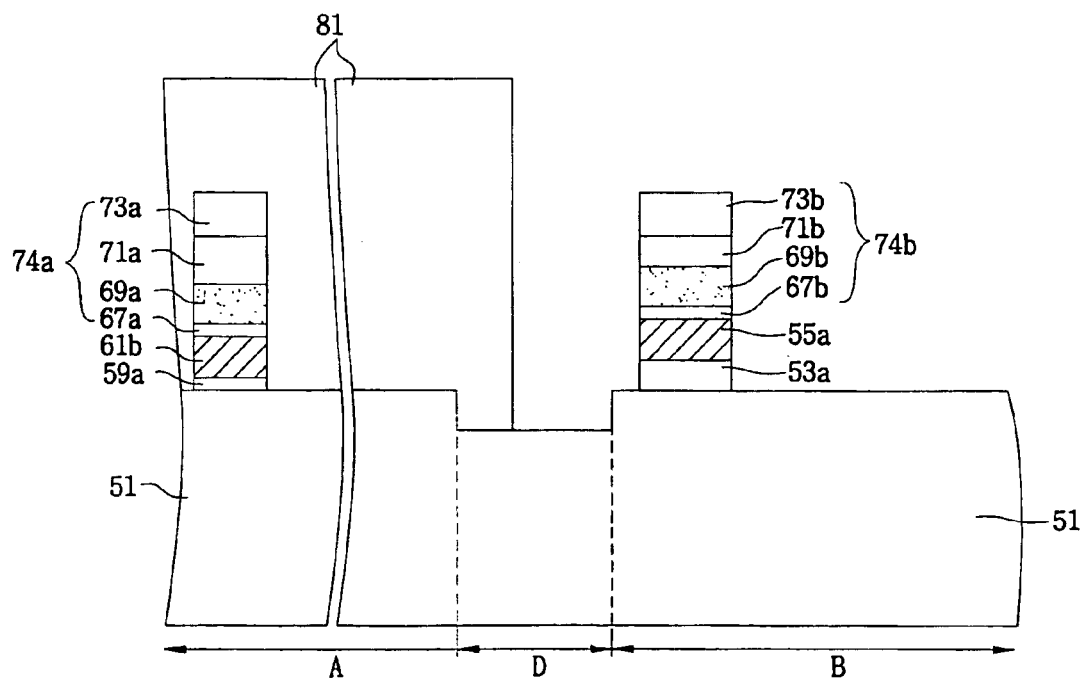
FIGS. 16 to 19 are cross-sectional diagrams illustrating self-aligned trench isolation methods according to other embodiments of the invention and semiconductor memory devices fabricated using the same.

Referring to FIG. 16, the first and second lower gate electrode patterns 55a and 61b are formed in the same manner as the embodiments described with reference to FIGS. 9 to 13. As a result, a recessed region (refer to the groove region G of FIG. 13) is formed in the border region D. A third photoresist pattern 81 is then formed to cover the cell array region A.

Figure 17:
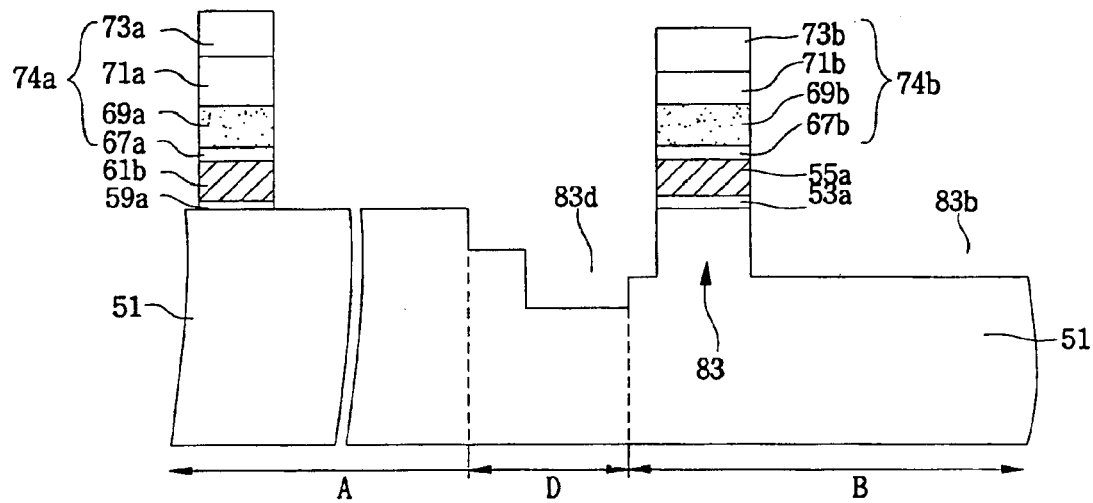

Referring to FIG. 17, the exposed portion of the semiconductor substrate 51 is etched using the third photoresist pattern 81 and the first trench mask pattern 74b as etching masks, thereby forming a preliminary peripheral circuit trench region 58b and a preliminary border trench region 85d in the peripheral circuit region B and the border region D respectively. The preliminary border trench region 85d is formed to be deeper than the preliminary peripheral circuit trench region 85b due to the groove region G. The preliminary peripheral circuit trench region 85b defines a peripheral circuit active region 83 in the peripheral circuit region B. Then, the third photoresist pattern 81 is removed.

Figure 18:
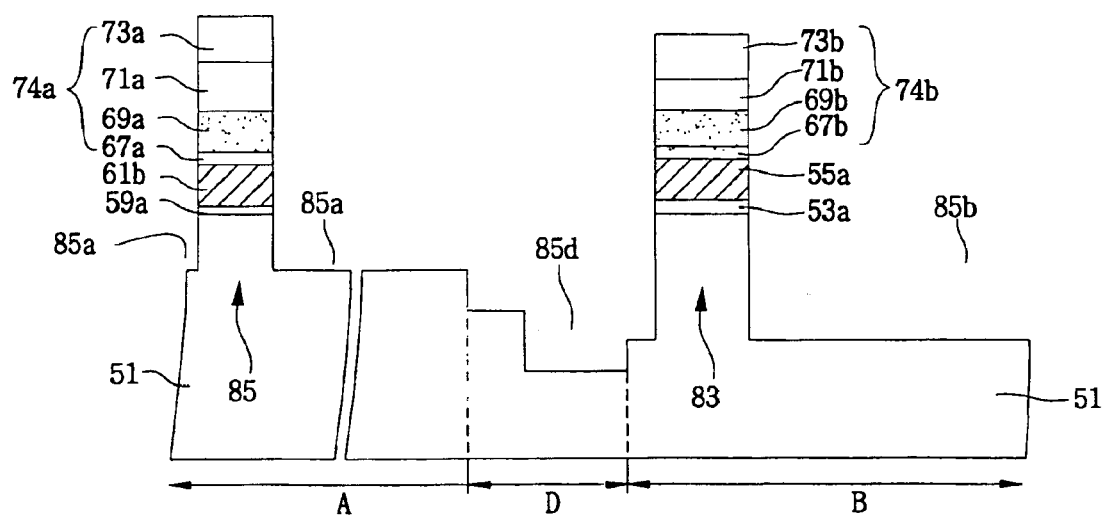
Figure 19:
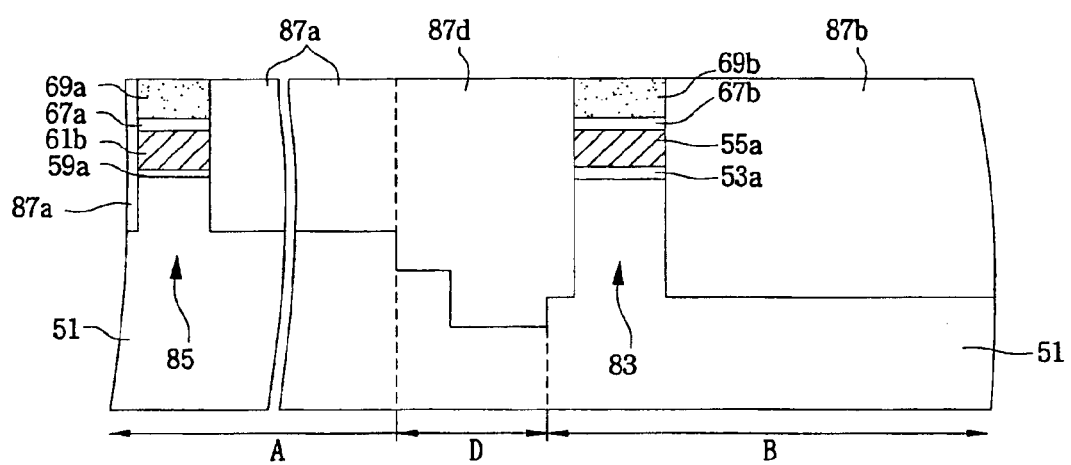

Referring to FIGS. 18 and 19, the semiconductor substrate 51 is again etched using the first and second trench mask patterns 74b and 74a as etching masks to form a peripheral circuit trench region 85b, a border trench region 85d, and a cell trench region 85a in the peripheral circuit region B, the border region D, and the cell array region A, respectively. As a result, as shown in FIG. 18, the peripheral circuit trench region 85b is formed to be deeper than the cell trench region 85a, and the border trench region 85d is formed to be deeper than the peripheral circuit trench region 85b. The cell trench region 85a defines a cell active region 85 in the cell array region A. A cell isolation layer 87a, a peripheral isolation layer 87b and a border isolation layer 87d are formed in the cell trench region 85a, the peripheral circuit trench region 85b and the border trench region 85d, respectively. The isolation layers 87a, 87b and 87d may be formed using a CMP technique. In this case, the first and second polishing stopper layers 69a and 69b are exposed.

Referring back to FIGS. 14 and 15, other structures of the semiconductor devices according to some embodiments of the invention will be described. A semiconductor substrate 51 includes a first region B, a second region A spaced apart from the first region B, and a border region D located between the first and second regions B and A. The first region B may correspond to a peripheral circuit region of a semiconductor device such as a flash memory device. In this case, the second region A corresponds to a cell array region of a flash memory device. A first trench region 77 is provided at the semiconductor substrate 51 in the first region B to define a first active region 77b. Similarly, a second trench region 77 is provided at the semiconductor substrate 51 in the second region A to define a second active region 77a. Also, a border trench region 77d is provided at the semiconductor substrate 51 in the border region D. The border trench region 77d is deeper than the first and second trench regions 77.

The first and second regions B and A may correspond to a peripheral circuit region and a cell array region of a semiconductor device such as a flash memory device, respectively. In this case, the first active region 77b corresponds to a peripheral circuit active region, and the second active region 77a corresponds to a cell active region. In addition, the first and second trench regions 77 correspond to a peripheral trench region and a cell trench region, respectively.

A first gate insulating layer 53a and a first lower gate electrode pattern 55a are sequentially stacked on the first active region 77b, and a second gate insulating layer 59a and a second lower gate electrode pattern 61b are sequentially stacked on the second active region 77a. The first gate insulating layer 53a has a different thickness from the second gate insulating layer 59a. In particular, when the first and second regions B and A correspond to the peripheral and cell array region of the flash memory device respectively, the first and second gate insulating layers 53a and 59a correspond to a peripheral circuit gate insulating layer and a tunnel oxide layer respectively, and the second lower gate electrode pattern 61b corresponds to a lower floating gate pattern.

The first and second trench regions 77 and the border trench region 77d are filled with an isolation layer 79.

Referring back to FIGS. 18 and 19, other structures of the semiconductor devices according to further embodiments of the invention will be described. A semiconductor substrate 51 includes a first region B, a second region A spaced apart from the first region B, and a border region D located between the first and second regions B and A. A first trench region 85b is provided at the semiconductor substrate 51 in the first region B to define a first active region 83, and a second trench region 85a is provided at the semiconductor substrate 51 in the second region A to define a second active region 85. Also, a border trench region 85d is provided at the semiconductor substrate 51 in the border region D. The first trench region 85b, e.g., a peripheral trench region is deeper than the second trench region 85a, e.g., a cell trench region, and the border trench region 85d is deeper than the first trench region 85b.

The first active region 83 is covered with a first gate insulating layer 53a and a first lower gate electrode pattern 55a which are sequentially stacked, and the second active region 85 is covered with a second gate insulating layer 59a and a second lower gate electrode pattern 61b which are sequentially stacked.

The cell trench region 85a is filled with a cell isolation layer 87a, and the peripheral circuit trench region 85b is filled with a peripheral circuit isolation layer 87b. Also, the border trench region 85d is filled with a border isolation layer 87d. Consequently, the peripheral circuit isolation layer 87b is thicker than the cell isolation layer 87a, and the border isolation layer 87d is thicker than the peripheral circuit isolation layer 87b.

According to embodiments of the invention described above, two different gate conductive layers do not overlap with each other in the border region between the cell array region and the peripheral circuit region. Hence, it can prevent any patterns from being lifted off during a subsequent wet etching process.

There are many way to practice the invention. What follows are descriptions of example, non-limiting, embodiments of the invention.

Embodiments of the invention provide a self-aligned trench isolation method. The method includes forming a first gate pattern on a first region of a semiconductor substrate. The first gate pattern is formed to have a first gate insulating layer pattern, a first lower gate conductive layer pattern, and a gate etching stopper layer pattern which are sequentially stacked. A second gate pattern is formed on a second region spaced apart from the first region to define a border region between the first and second regions. The second gate pattern is formed to include a second gate insulating layer pattern and a second lower gate conductive layer pattern, which are sequentially stacked. The gate etching stopper layer pattern is removed to expose the first lower gate conductive layer pattern. First and second trench mask patterns are formed on predetermined regions of the first and second lower gate conductive layer patterns, respectively. The first and second lower gate conductive layer patterns and the first and second gate insulating layer patterns are etched using the first and second trench mask patterns as etching masks. As a result, first and second lower gate electrode patterns are formed below the first and second trench mask patterns, respectively. The semiconductor substrate in the border region may also be etched while the first and second lower gate conductive layer patterns are etched. Accordingly, a groove region having a predetermined depth may be formed in the border region. The semiconductor substrate is etched using the first and second trench mask patterns as etching masks to form trench regions. In this case, the trench region in the border region is formed to be deeper than the trench regions in the first and second regions.

In some embodiments, the first and second regions may be a peripheral circuit region and a flash memory cell array region, respectively. In this case, the first and second gate insulating layer patterns correspond to a peripheral circuit gate insulating layer and a tunnel oxide layer, respectively.

In further embodiments, the trench region in the first region may be formed to be deeper than that in the second region.

In yet further embodiments, an isolation layer is formed in the trench regions.

Other embodiments of the invention provide a semiconductor device. The semiconductor device includes a semiconductor substrate having first and second regions spaced apart from each other and a border region located between the first and second regions. A first trench region is located at a predetermined region of the semiconductor substrate in the first region. The first trench region defines a first active region in the first region. Similarly, a second trench region is located at a predetermined region of the semiconductor substrate in the second region. The second trench region defines a second active region in the second region. Also, a border trench region is located at the semiconductor substrate in the border region. The border trench region is deeper than the first and second trench regions.

In some embodiments, a first gate insulating layer and a first lower gate electrode pattern may be sequentially stacked on the first active region, and a second gate insulating layer and a second lower gate electrode pattern may be sequentially stacked on the second active region. The first gate insulating layer may have a different thickness from the second gate insulating layer.

In further embodiments, the first and second regions may correspond to a peripheral circuit region and a flash memory cell array region respectively. In this case, the first gate insulating layer may be a peripheral circuit gate insulating layer, and the second gate insulating layer may be a tunnel oxide layer.

In yet further embodiments, the first trench region may be deeper than the second trench region.

In yet other embodiments, the first trench region, the second trench region and the border trench region may be filled with an isolation layer.

While the invention has been particularly shown and described with reference to preferred embodiments thereof, it will be understood by those skilled in the art that the foregoing and other changes in form and details may be made therein without departing from the spirit and scope of the invention.

I claim:

1. A self-aligned trench isolation method, comprising:

forming a first gate pattern on a first region of a semiconductor substrate, the first gate pattern having a first gate insulating layer pattern, a first lower gate conductive layer pattern and a gate etching stopper layer pattern that are sequentially stacked;

forming a second gate pattern on a second region spaced apart from the first region to define a border region between the first and second regions, the second gate pattern being formed to have a second gate insulating layer pattern and a second lower gate conductive layer pattern which are sequentially stacked;

removing the gate etching stopper layer pattern to expose the first lower gate conductive layer pattern;

forming first and second trench mask patterns on predetermined regions of the first and second lower gate conductive layer patterns, respectively;

etching the first and second lower gate conductive layer patterns and the first and second gate insulating layer patterns using the first and second trench mask patterns as etching masks to form first and second lower gate electrode patterns below the first and second trench mask patterns, respectively, the semiconductor substrate in the border region being etched during the etching process of the first and second lower gate conductive layer patterns to generate a groove region having a predetermined depth in the border region; and etching the semiconductor substrate using the first and second trench mask patterns as etching masks to form trench regions, the trench region in the border region being formed to be deeper than the trench regions in the first and second regions.

2. The method of claim 1, wherein the first and second lower gate conductive layer patterns are formed of the same material layer as the semiconductor substrate.

3. The method of claim 1, wherein the gate etching stopper layer pattern is formed of a silicon oxide layer.

4. The method of claim 1, wherein forming a second gate pattern comprises:

sequentially forming a second gate insulating layer having a different thickness from the first gate insulating layer pattern and a second lower gate conductive layer on the semiconductor substrate having the first gate pattern;

forming a photoresist pattern covering the second region spaced apart from the first region on the second lower gate conductive layer; and etching the second lower gate conductive layer using the photoresist pattern as an etching mask.

5. The method of claim 4, further comprising:

forming a hard mask layer on the second lower gate conductive layer prior to formation of the photoresist pattern;

etching the hard mask layer using the photoresist pattern as an etching mask to form a hard mask pattern; and removing the hard mask pattern together with the gate etching stopper layer pattern.

6. The method of claim 5, wherein forming the hard mask layer comprises forming the hard mask layer from the same material layer as the gate etching stopper layer pattern.

7. The method of claim 1, wherein forming the first and second trench mask patterns comprises:
forming a trench mask layer on the semiconductor substrate where the first lower gate conductive layer pattern is exposed; and
patterning the trench mask layer.

8. The method of claim 7, wherein the trench mask layer includes at least a polishing stopper layer.

9. The method of claim 7, wherein forming the trench mask layer comprises sequentially stacking a buffer oxide layer, a polishing stopper layer, and a hard mask layer.

10. The method of claim 1, wherein etching the semiconductor substrate to form trench regions comprises:
forming a photoresist pattern on the semiconductor substrate having the groove region, the photoresist pattern being formed to cover the second region;
etching the semiconductor substrate using the photoresist pattern and the first trench mask pattern as etching masks to form a first preliminary trench region and a preliminary border trench region that is deeper than the first preliminary trench region in the first region and the border region, respectively;
removing the photoresist pattern; and
etching the semiconductor substrate using the first and second trench mask patterns as etching masks to form a first trench region and a second trench region that is shallower than the first trench region in the first and second regions respectively and to simultaneously form a border trench region which is deeper than the first and second trench regions in the border region.

11. The method of claim 1, further comprising forming isolation layers in the trench regions.

12. A method comprising:
forming a peripheral circuit gate pattern on a predetermined region of a semiconductor substrate to define a peripheral circuit region, the peripheral circuit gate pattern being formed to have a peripheral circuit gate insulating layer pattern, a first tower gate conductive layer pattern, and a gate etching stopper layer pattern that are sequentially stacked;
forming a cell gate pattern on a region spaced apart from the peripheral circuit region to define a cell array region below the cell gate pattern and to simultaneously define a border region between the peripheral circuit region and the cell array region, the cell gate pattern being formed to have a tunnel oxide layer pattern and a second lower gate conductive layer pattern that are sequentially stacked;
removing the gate etching stopper layer pattern to expose the first lower gate conductive layer pattern;
forming first and second trench mask patterns on predetermined regions of the first and second lower gate conductive layer patterns, respectively;
etching the first and second lower gate conductive layer patterns, the tunnel oxide layer pattern, and the peripheral circuit gate insulating layer pattern using the first and second trench mask patterns as etching masks to form a lower floating gate pattern and a lower gate electrode pattern below the first and second trench mask patterns, respectively, the semiconductor substrate in the border region being etched during the etching process of the first and second lower gate conductive layer patterns to generate a groove region having a predetermined depth; and
etching the semiconductor substrate using the first and second trench mask patterns as etching masks to form trench regions, the trench region in the border region formed to be deeper than the trench regions in the peripheral circuit region and the cell array region.

13. The method of claim 12, wherein forming the cell gate pattern comprises:
sequentially forming a tunnel oxide layer having a different thickness from the peripheral circuit gate insulating layer pattern and a second lower gate conductive layer on the semiconductor substrate having the peripheral circuit gate pattern;
forming a photoresist pattern spaced apart from the peripheral circuit region on the second lower gate conductive layer to define the cell array region; and
etching the second lower gate conductive layer using the photoresist pattern as an etching mask.

14. The method of claim 13, further comprising:
forming a hard mask layer on the second lower gate conductive layer prior to formation of the photoresist pattern;
etching the hard mask layer using the photoresist pattern as an etching mask to form a hard mask pattern; and
removing the hard mask pattern together with the gate etching stopper layer pattern.

15. The method of claim 12, wherein forming the first and second trench mask patterns comprises:
forming a trench mask layer on the semiconductor substrate where the first lower gate conductive layer pattern is exposed; and
patterning the trench mask layer.

16. The method of claim 15, wherein the trench mask layer comprises at least a polishing stopper layer.

17. The method of claim 15, wherein forming the trench mask layer comprises sequentially stacking a buffer oxide layer, a polishing stopper layer, and a hard mask layer.

18. The method of claim 12, wherein etching the semiconductor substrate to form trench regions comprises:
forming a photoresist pattern covering the cell array region on the semiconductor substrate having the groove region;
etching the semiconductor substrate using the photoresist pattern and the first trench mask pattern as etching masks to form a preliminary peripheral circuit trench region and a preliminary border trench region that is deeper than the preliminary peripheral circuit trench region in the peripheral circuit region and the border region, respectively;
removing the photoresist pattern; and
etching the semiconductor substrate using the first and second trench mask patterns as etching masks to form a peripheral circuit trench region and a cell trench region that is shallower than the peripheral circuit trench region in the peripheral circuit region and the cell array region respectively and to simultaneously from a border trench region that is deeper than the peripheral circuit trench region in the border region.

19. The method of claim 12, further comprising forming isolation layers in the trench regions.

20. A semiconductor device, comprising:
a semiconductor substrate having a first region, a second region spaced apart from the first region, and a border region between the first and second regions;
a first trench region disposed in the first region to define a first active region;
a second trench region disposed in the second region to define a second active region, the first trench region deeper than the second trench region; and a border trench region disposed in the border region, the border trench region deeper than the first and second trench regions, the semiconductor in the border trench region having a step profile consisting of at least two substantially horizontal surfaces, one of the at least two substantially horizontal surfaces deeper than the second trench region and another one of the at least two substantially horizontal surfaces deeper than the first trench region.

21. The device of claim 20, wherein the first region comprises a peripheral circuit region and the second region comprises a flash memory cell array region.

22. The device of claim 20, further comprising:
a first gate insulating layer and a first lower gate electrode pattern that are sequentially stacked on the first active region; and
a second gate insulating layer and a second lower gate electrode pattern that are sequentially stacked on the second active region, the second gate insulating layer having a different thickness from the first gate insulating layer.

23. The device of claim 20, further comprising isolation layers that fill the first trench region, the second trench region, and the border trench region.

* * * * *

UNITED STATES PATENT AND TRADEMARK OFFICE
CERTIFICATE OF CORRECTION

PATENT NO. : 6,953,973 B2  
APPLICATION NO. : 10/798610  
DATED : October 11, 2005  
INVENTOR(S) : Kim Page 1 of 1

It is certified that error appears in the above-identified patent and that said Letters Patent is hereby corrected as shown below:

At column 11, line 38, please replace "a first tower gate" with --a first lower gate--

Signed and Sealed this

Twenty-first Day of November, 2006

JON W. DUDAS  
*Director of the United States Patent and Trademark Office*